United States Patent
Ehara

(10) Patent No.: US 6,175,142 B1
(45) Date of Patent: *Jan. 16, 2001

(54) PIN PHOTODIODE

(75) Inventor: Toshihiro Ehara, Kanagawa-ken (JP)

(73) Assignee: Stanley Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/977,287

(22) Filed: Nov. 24, 1997

(30) Foreign Application Priority Data

Dec. 20, 1996 (JP) .................................................. 8-341773

(51) Int. Cl.$^7$ .................................................. H01L 31/06
(52) U.S. Cl. .......................... 257/464; 257/458; 257/461
(58) Field of Search ..................................... 257/458, 459, 257/461, 615, 626, 632, 464; 250/372

(56) References Cited

U.S. PATENT DOCUMENTS 5,061,977 * 10/1991 Funaba ................................. 257/458
5,391,910 * 2/1995 Fujimura et al. ..................... 257/458
5,596,186 * 1/1997 Kobayashi ........................ 250/214.1
5,682,037 * 10/1997 De Cesare et al. ................... 250/372

* cited by examiner

Primary Examiner—Mahshid Saadat
Assistant Examiner—George C. Eckert, II
(74) Attorney, Agent, or Firm—Weingarten, Schurgin, Gagnebin & Hayes LLP

(57) ABSTRACT

A PIN photodiode comprising a P-type layer, an N-type layer, and an I-type layer provided between said, P-type layer and said N-type layer, wherein a junction surface between said I-type layer and said N-type layer is formed by joining a high specific resistance wafer preformed as said I-type layer to a high concentration N-type wafer preformed as said N-type layer. The thickness of said high specific resistance wafer has been adjusted in accordance with the peak value of the wavelength of light rays to be accepted. Therefore, $N^+$ carriers do not exist in the I-type layer and the thickness of the I-type layer can be freely defined, causing the frequency characteristic and the wavelength sensitivity characteristic to be satisfying.

2 Claims, 3 Drawing Sheets

PIN PHOTODIODE

BACKGROUND OF THE INVENTION

1. Field of the Invention

The present invention relates to a PIN photodiode used as a receiving element for converting a light wave to an electric signal in an optical communication, more particularly relates to improvements in characteristics such as a frequency characteristic or a wavelength sensitivity characteristic.

2. Background Art

Examples of conventional PIN photodiodes are shown in FIGS. 4 and 7. A high concentration N-type layer (an $N^{30}$ layer) 91 in a PIN photodiode 90 shown in FIG. 4(A) is formed by a diffusion from one surface of a high specific resistance silicon wafer 92A. The thickness of an I-type layer 92 as a remaining part is determined by the control of the diffusion. Further, a high concentration P-type layer (a $P^{30}$ layer) 93 is formed by a diffusion from the opposite surface to the N-type layer 91, thereby forming the basic constitution of a PIN photodiode 90.

Since the high concentration N-type layer (an $N^+$ layer) 91 is formed by the diffusion as described, some $N^+$ carriers (hereinafter referred to as "N carriers") are diffused into the I-type layer 92. The concentration distribution B1 of the N carriers in the N-type layer 91 and the I-type layer 92 will have a gentle slope as shown in FIG. 4(B). This means a depletion layer 94 is a shallow layer which does not reach a junction surface 95 between the N-type layer 91 and the I-type layer 92.

An I-type layer 82 in a PIN photodiode 80 shown in FIG. 7(A) is formed by an epitaxial growth on one surface of a high concentration N-type wafer 81A as shown in FIG. 8. In this conventional art, the thickness of the I-type layer 82 is determined by, for example, a time control of the epitaxial growth. Further, a P-type layer 83 is formed as well as the above-described conventional art.

Since the I-type layer 82 is formed by the epitaxial growth on the preformed N-type layer (the $N^+$ layer) 81, it is possible to form the I-type layer 82 which does not contain so many N carriers. The concentration distribution B2 of the N carriers in the N-type layer 81 and the I-type layer 82 will have a step-like shape as shown in FIG. 7(B). This means a depletion layer 84 substantially reaches a junction surface 85 between the N-type layer 81 and the I-type layer 82.

However, there are some problems with regard to the PIN photodiodes 80 and 90 as following. As for the photodiode 90, although there is an advantage that the wavelength sensitivity of light rays depending on the thickness of the I-type layer 92 can be easily defined due to the easiness for controlling the thickness of the I-type layer 92, there is a problem that it can not deal with optical communication requiring a high-speed characteristic due to the shallowness of the depletion layer 94 which leads a response frequency characteristic F1 to be 10 MHz at most as shown in FIG. 6.

As for the photodiode 80, the depletion layer 84 substantially reaches the junction surface 85 of the N-type layer 81 and the I-type layer 82, and therefore about 200 MHz of a response frequency characteristic F2 can be obtained as shown in FIG. 9. However, it is substantially impossible to form a thick I-type layer with a thickness of, for example, at least 30 μm (preferably at least 40 μm) by the epitaxial growth, which causes the peak value of wavelength sensitivity to be shifted to a short wavelength side. This makes a problem that the peak value can not be conformed to the oscillating wavelength of a semiconductor laser which is practically used.

In addition, since the epitaxial growth process by which the I-type layer 82 in the photodiode 80 is formed is a difficult process, it takes too much time for forming the I-type layer 82 even if the thickness of the I-type layer 82 is restricted to, for example, 20 μm, and leads the PIN photodiode 80 to a low yield, which in turn raises the cost of the PIN diode 80.

SUMMARY OF THE INVENTION

Accordingly, a general object of the present invention is to provide a PIN photodiode having a high response frequency, by which it is possible to freely define the wavelength sensitivity.

In order to achieve the foregoing object and others, the present invention provides a PIN photodiode comprising a P-type layer, an N-type layer, and an I-type layer provided between said P-type layer and said N-type layer, wherein a junction surface between said I-type layer and said N-type layer is formed by joining a high specific resistance wafer preformed as said I-type layer to a high concentration N-type wafer preformed as said N-type layer.

In the PIN photodiode of the present invention, the thickness of said high specific resistance wafer has been preferably adjusted in accordance with the peak value of the wavelength of light rays to be received.

Other features and advantages of the present invention will be apparent from the following description taken in connection with the accompanying drawing.

DETAILED DESCRIPTION OF THE PREFERRED EMBODIMENTS

Figure 1A:
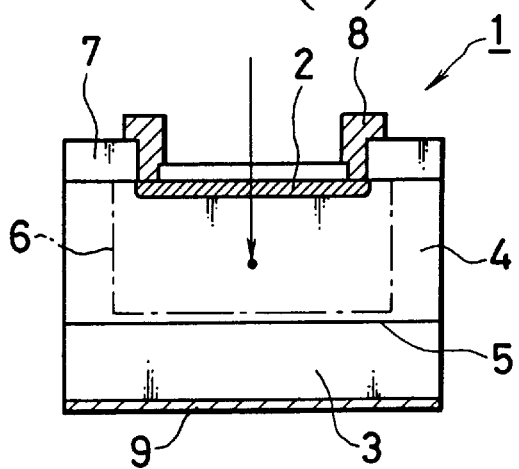
FIG. 1(A) is a cross section of a PIN photodiode according to one embodiment of the present invention.
Figure 1B:
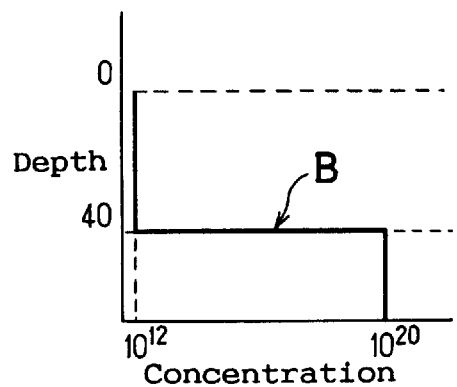
FIG. 1(B) is a graph indicating a concentration distribution of the carriers in the PIN photodiode shown in FIG. 1(A).

Turning now to the drawings and referring first to FIG. 1(A), reference numeral 1 designates a PIN photodiode in accordance with one embodiment of the present invention. The PIN photodiode 1 is basically formed by providing an I-type layer 4 between a P-type layer 2 and an N-type layer 3 as well as the prior art.

Figure 2:
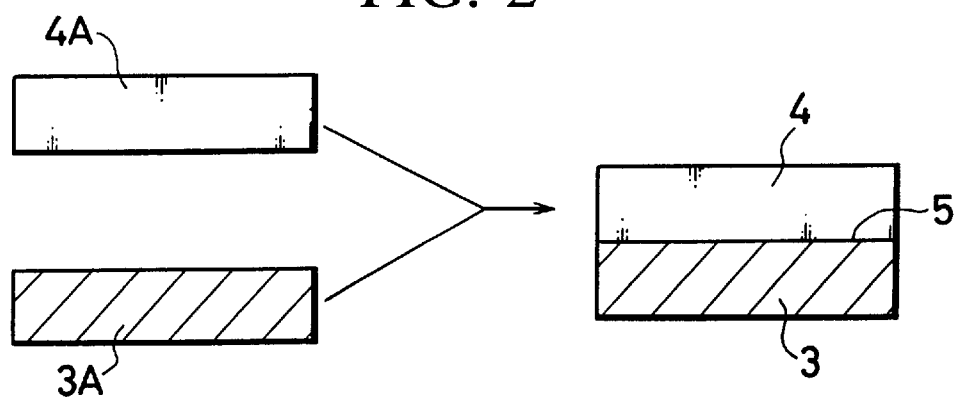
FIG. 2 is side views showing a process by which a junction surface between the N-type layer and the I-type layer is formed according to one embodiment of the present invention.

In the present embodiment, a junction surface 5 of the I-type layer 4 and the N-type layer 3 is formed by joining or putting together a high specific resistance wafer 4A preformed as the I-type layer 4 to a high concentration N-type wafer 3A preformed as the N-type layer 3, as shown in FIG. 2. Therefore, N carriers in the N-type layer 3 never diffuse into the I-type layer 4, which allows a step-like concentration distribution B of the N carriers with the junction surface 5 as a border to be obtained. The joining method employed in the present invention is carried out, for example, by polishing the respective surfaces of the wafers 3A and 4A to be joined, putting together the surfaces, and heating the put wafers to form the junction surface 5.

Figure 3:
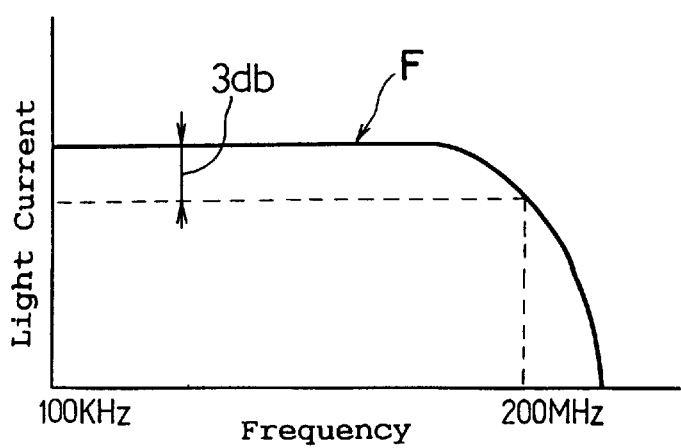
FIG. 3 is a graph indicating a response frequency characteristic of the PIN photodiode according to one embodiment of the present invention.
Figure 4A:
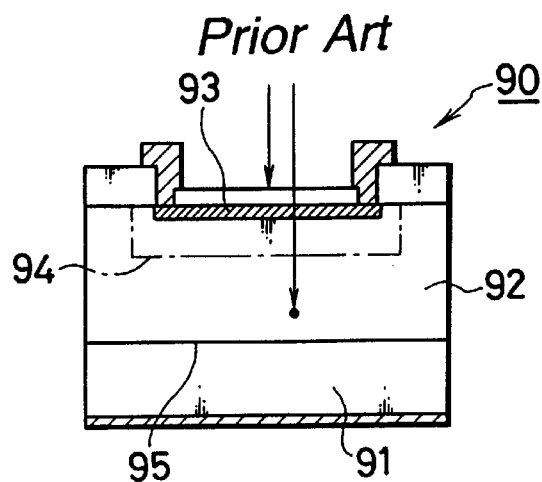
FIG. 4(A) is a cross section of a prior PIN photodiode.
Figure 4B:
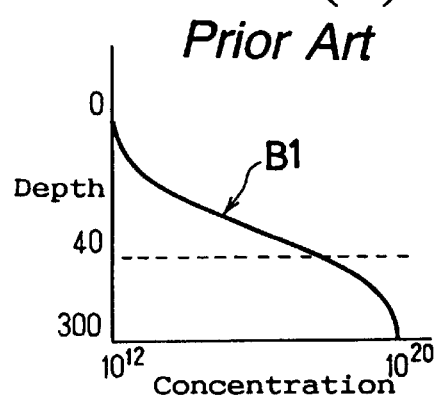
FIG. 4(B) is a graph indicating a concentration distribution of the carriers in the PIN photodiode shown in FIG. 4(A).
Figure 5:
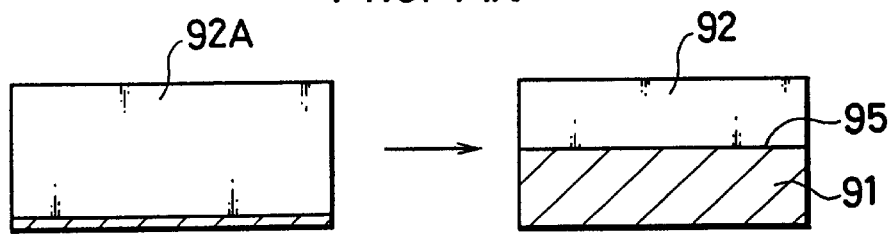
FIG. 5 is side views showing a prior process by which a junction surface between the N-type layer and the I-type layer is formed.
Figure 6:
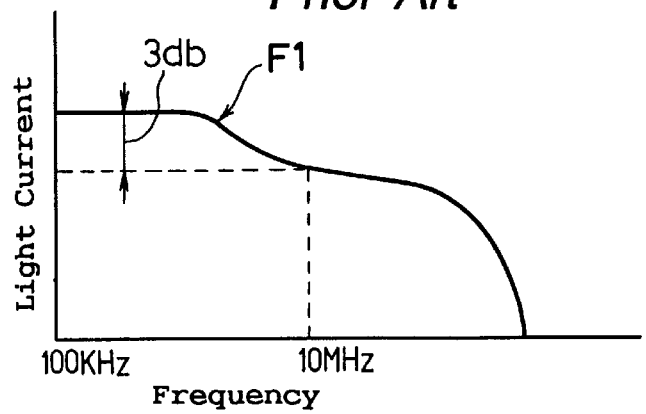
FIG. 6 is a graph indicating a response frequency characteristic of the prior PIN photodiode.

Thus, the depletion layer 6 of the PIN photodiode 1 substantially reaches the junction surface 5. Therefore a high-speed response frequency characteristic of about 200 MHz can be obtained as shown in FIG. 3, as well as the prior PIN photodiode in which the I-type layer is formed by an epitaxial growth.

Figure 7A:
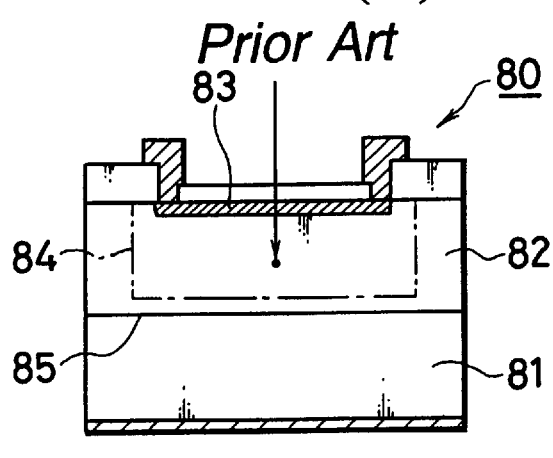
FIG. 7(A) is a cross section of another prior PIN photodiode.
Figure 7B:
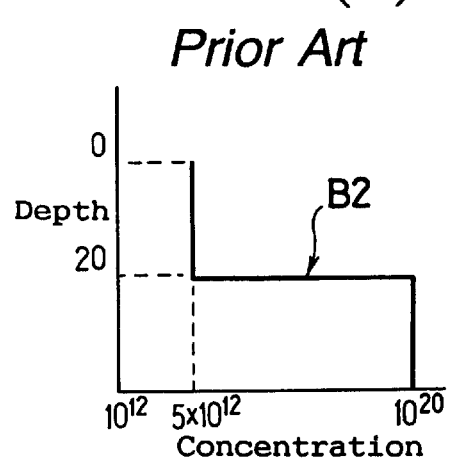
FIG. 7(B) is a graph indicating a concentration distribution of the carriers in the PIN photodiode shown in FIG. 7(A).
Figure 8:
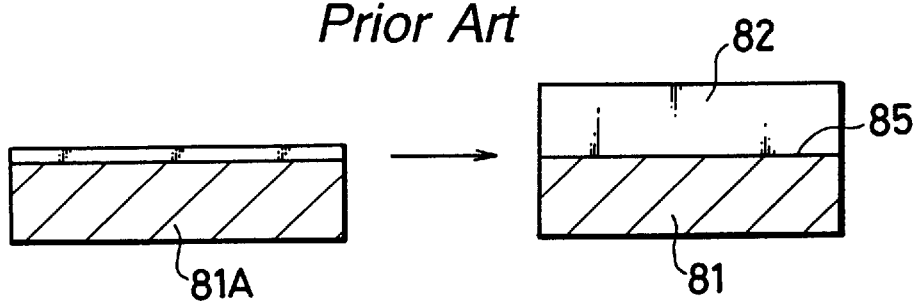
FIG. 8 is side views showing another prior process by which a junction surface between the N-type layer and the I-type layer is formed.
Figure 9:
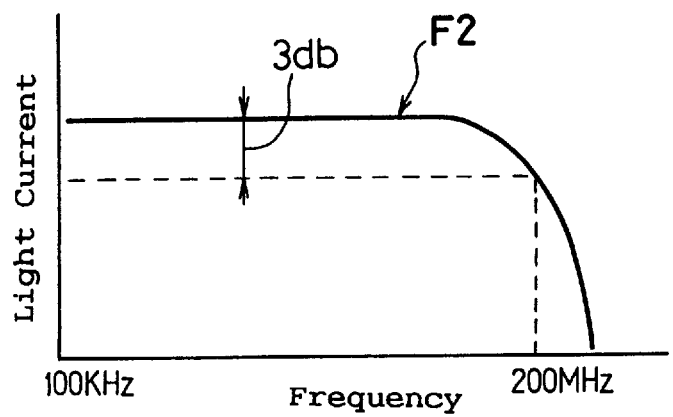
FIG. 9 is a graph indicating a response frequency characteristic of the prior PIN photodiode.

Strictly compared, the high specific resistance wafer 4A is never influenced by the high concentration N-type wafer 3A, because they are formed as completely independent body according to the present embodiment. The concentration of the N carriers in the high specific resistance wafer 4A will be lower than that of the prior art shown in FIG. 7, allowing the depletion layer 6 to be much closer to the junction surface 5, which in turn causes the response frequency characteristic F to be more excellent than that of the prior art in which the I-type layer is formed by the epitaxial growth.

It is now considered about wavelength sensitivity. The peak value of the wavelength sensitivity is substantially determined by the thickness of the I-type layer 4. In the present embodiment, the thickness of the I-type layer 4 is freely defined or adjusted, because the high specific resistance wafer 4A to be the I-type layer 4 and the high concentration N-type wafer 3A to be the N-type layer 3 are preformed in separate and jointed.

Therefore, for example, the adjustment of the peak value of the wavelength sensitivity in receiving light rays to the oscillating wavelength of a semiconductor laser or the like adopted for a transmitter in optical communication is remarkably facilitated, thereby allowing more large output for a transmitted signal with the same level to the prior art to be acquired.

Reference numeral 7 in FIG. 1(A) is a protective film used for restricting a diffused area when the P-type layer 2 is formed by a diffusion and the like. Reference numeral 8 designates an anode electrode formed of gold, aluminum, or the like. Reference numeral 9 designates a cathode electrode similarly formed of gold, aluminum, or the like, and therefore an output is obtained between the anode electrode 8 and the cathode electrode 9.

Data on an experimentally manufactured PIN photodiode 1 is stated for reference. A response frequency characteristic F was sufficiently high-speed as 249.3 MHz, and wavelength sensitivity was confirmed that it is exactly conformed to the oscillating wavelength of a semiconductor laser practically used, where the dimensions of the chip were 1.5 W×1.5 L×0.3 H (mm) and the thickness of the I-type layer 4 was 40 µm.

As described above, the present invention is a PIN photodiode comprising a P-type layer, an N-type layer, and an I-type layer provided between said P-type layer and said N-type layer, wherein a junction surface between said I-type layer and said N-type layer is formed by joining a high specific resistance wafer preformed as said I-type layer to a high concentration N-type wafer preformed as said N-type layer. Therefore, the present invention has a remarkably excellent effect that it is possible to lower the cost of the PIN photodiode having an excellent response frequency characteristic by eliminating the epitaxial growth process which is difficult, takes too much time for forming the I-type layer, and leads the PIN photodiode to a low yield.

Furthermore, since the high specific resistance wafer and the high concentration N-type wafer are preformed in separate, the thickness of the I-type layer or the high specific resistance wafer can be freely defined, which, for example, allows the peak value of the wavelength sensitivity in receiving light rays to be adjusted to the oscillating wavelength of a semiconductor laser adopted for a transmitter in optical communication, thereby more large receiving output can be obtained for a transmitted signal with the same intensity.

Therefore, the present invention also has a remarkably excellent effect that it is possible to increase performance of the PIN photodiode, as well as to increase the frequency characteristic as above-mentioned.

While there has been described what are at present considered to be a preferred embodiment of the present invention, it will be understood that various modifications may be made thereto, and it is intended that the appended claims cover all such modifications as fall within the true spirit and scope of the invention.

What is claimed is:

1. A PIN photodiode comprising a P-type layer, an N-type layer having a polished surface, and an I-type layer having a polished surface provided between said P-type layer and said N-type layer, said I-type polished surface in contact with said N-type polished surface, comprising a heat formed junction surface between said I-type layer and said N-type layer, with said I-type layer comprising before heat joining a high specific resistance wafer layer preform and said N-type wafer comprising before heat joining a high concentration N-type wafer layer preform; and a depletion layer between said N-type layer and said I-type layer extending substantially to said heat formed junction surface.

2. A PIN photodiode according to claim 1, wherein the thickness of said high specific resistance wafer has been adjusted in accordance with the peak value of the wavelength of light rays to be received.

* * * * *

UNITED STATES PATENT AND TRADEMARK OFFICE
CERTIFICATE OF CORRECTION

PATENT NO. : 6,175,142 B1
DATED : January 16, 2001
INVENTOR(S) : Toshihiro Ehara It is certified that error appears in the above-identified patent and that said Letters Patent is hereby corrected as shown below:

<u>Column 1,</u>
Line 12, "$N^{30}$" should read -- $N^+$ --; and
Line 18, "$P^{30}$" should read -- $P^+$ --.

Signed and Sealed this

First Day of January, 2002

Attest:

JAMES E. ROGAN
*Attesting Officer*     *Director of the United States Patent and Trademark Office*